United States Patent [19]
Tang

[11] Patent Number: 5,805,479
[45] Date of Patent: Sep. 8, 1998

[54] APPARATUS AND METHOD FOR FILTERING DIGITAL SIGNALS

[75] Inventor: Alex Tang, Hsinchu, Taiwan

[73] Assignee: United Microelectronics Corp., Hsinch, Taiwan

[21] Appl. No.: 533,531

[22] Filed: Sep. 25, 1995

[51] Int. Cl.[6] .................................................. G06F 17/10
[52] U.S. Cl. ........................ 364/724.13; 364/724.17
[58] Field of Search ................. 364/724.13, 724.16, 364/724.17

[56] References Cited

U.S. PATENT DOCUMENTS

| | | | |
|---|---|---|---|
| 4,881,191 | 11/1989 | Morton | 364/724.13 |
| 4,931,972 | 6/1990 | Obata et al. | 364/724.13 |
| 5,262,972 | 11/1993 | Holden et al. | 364/724.13 |
| 5,311,457 | 5/1994 | Shizawa | 364/724.13 |

*Primary Examiner*—David H. Malzahn
*Attorney, Agent, or Firm*—Cushman Darby & Cushman IP Group of Pillsbury Madison & Sutro LLP

[57] ABSTRACT

A digital filter for time-division multiplexing a set of digital signals has a multiplexer receiving the input signals and selecting one by control signal; a multiplexing digital filter receiving the selected signal and performing a filtering function, which consists of a string of pipeline registers wherein each one delays the input signal a finite time slot; a demultiplexer outputting said filtered signal to one terminal corresponding to the input signal by the same control signal. The method for filtering a set of digital signals matches each digital signal to its own state signals.

10 Claims, 4 Drawing Sheets

APPARATUS AND METHOD FOR FILTERING DIGITAL SIGNALS

BACKGROUND OF THE INVENTION

1. Field of the Invention

The present invention relates to an apparatus and method for filtering digital signals. More specifically, the present invention relates to an apparatus that filters a set of digital signals in the same manner by means of time-division multiplexing and a digital signal processing scheme.

2. Description of Related Art

Filters, devices for processing the frequency characteristic of signals, are widely applied in various fields, including telegraphy, control, communication, and the like. Especially following the maturity of the technology of digitization, digital filters have become critical and fundamental components in many applications, such as speech processing, radar, sonar, seismology, and the like.

Digital filters can be divided into two categories of impulse response filters, namely finite duration impulse response (FIR) digital filters, and infinite duration impulse response (IIR) digital filters. The measure of impulse response is the response of a specific system receiving an impulse signal.

FIG. 1 (Prior Art) is a schematic block diagram of an IIR digital filter. The generalized transfer function of an IIR digital filter is expressed as:

$$H(z) = \frac{a_0 + z^{-1}a_1 + z^{-2}a_2 + \ldots + z^{-n}a_n}{1 + z^{-1}b_1 + z^{-2}b_2 + \ldots + z^{-n}b_n} \quad (1)$$

wherein, $a_0$–$a_n$ are forward coefficients, $b_0$–$b_n$ are feedback coefficients The body of the IIR digital filter comprises essentially n unit-delay devices $D_1$–$D_n$, which are connected serially and formed as a cascaded string, as shown in FIG. 1. The input terminal of the x-th unit-delay device is connected to the output terminal of the (x-1)th unit-delay device, where x is any integer between 2 to n. The function of a unit-delay device is that it receives a signal and then outputs said signal after a certain interval of time. The symbol of a unit-delay device can be represented by a form of $Z^{-1}$ and implemented by a D-type flip-flop.

The data in the output terminals of all n unit-delay devices constitute the state of a digital filter. The data in the output terminals of the digital filter are derived from the state and the data in the input terminals of the digital filter. Referring to FIG. 1, the detailed description is stated as follows. Data in the output terminals of the n unit-delay devices $D_1$–$D_n$, that is, the state of the digital filter, is transmitted to the input terminals of a set of feedback multipliers $10_1$–$10_n$ having multiplication coefficients $b_1$–$b_n$, and multiplied by their individual feedback coefficients, then added to the input terminal x of the digital filter transmitted to input terminals of a first adder $A_1$, to calculate the result. Then the result of the first adder $A_1$ in addition to the data in the output terminals of the n unit-delay devices $D_1$–$D_n$, is sent to the input terminals of a set of forward multipliers $12_1$–$12_n$, having multiplication coefficients $a_1$–$a_n$, and multiplied by their individual forward coefficients, then transmitted to input terminals of a second adder $A_2$. As a result, data in the output terminal Y of the second adder $A_2$ represents the properly filtered signal.

All the above-mentioned data manipulations are performed in real-time, except in the n unit-delay devices $D_1$–$D_n$, of the main stream. If the coefficient of any multiplier is 1, the circuit of implementation of this multiplier is a short-circuit. On the other hand, if the coefficient of any multiplier is 0, the circuit of implementation of this multiplier is an open-circuit. Referring to Equation (1), if all coefficients $b_1$–$b_n$, of feedback multipliers $10_1$–$10_n$, are set to zero, Equation (1) can be derived as:

$$H(z) = 1 + z^{-1}a_1 + z^{-2}a_2 + \ldots + z^{-n}a_n \quad (2)$$

Equation (2) represents as the common form of transfer function of a FIR digital filter.

For the conventional configuration of the above-mentioned digital filter, the method to manipulate a number of distinct digital signals with the same characteristics of filtering is to utilize a number of duplicate digital filters for all digital signals. However, such a scheme is inefficient and, especially in an integrated circuit, occupies a large amount of chip space.

Another scheme to solve such a problem is to filter these distinct digital signals using time-division multiplexing. The scheme of time-division multiplexing is that time is divided into a plurality of time slots and each time slot belongs to one of these digital signals waiting for filtering. More explicitly, the first time slot belongs to the first digital signal, the second time slot to the second digital signal, the third time slot to the third digital signal, etc., the N-th time slot to the N-th digital signal, then the (N+1)th time slot to the first digital signal cyclically, and so on. However, the conventional configuration of digital filters is inappropriate for implementing such a scheme. Referring to FIG. 1, which is a general form of an IIR digital filter, assume that the initial state signals of this digital filter are all zero. In the first time slot, a first bit of the first input signal will enter this digital filter, and after being manipulated, be stored into the output terminal of unit-delay device $D_1$, that is, the state of the digital filter. In the second time slot, a first bit of the second input signal will enter this digital filter and be manipulated under the state of the digital signal. It is obvious that the first input signal and second input signal will crosstalk with each other in the second time slot. This situation will occur in both IIR and the FIR digital filters.

SUMMARY OF THE INVENTION

The present invention provides an apparatus for digitally filtering, especially for filtering a plurality of digital signals with the same characteristics of filtering by time-division multiplexing.

In a second aspect, the present invention provides a method for filtering a plurality of digital signals by a scheme of time-division multiplexing.

This invention provides a digital filter for receiving m input signals and a control signal and perform a certain filtering function, wherein m is an integer greater than 1. The digital filter comprises a multiplexer receiving the m input signals for outputting a sample signal selected from the m input signals decided by the control signal; n pipeline registers serially connected, each pipeline register holding its input signal for m delay time; n feedback multipliers, receiving output signals of the n pipeline registers and multiplied by feedback coefficients, respectively; a first adder, receiving the sample signal and output signals of the n feedback multipliers and outputting an input signal of the first one of the n feedback multipliers; n+1 forward multipliers, receiving input signals of the n pipeline registers and an output signal of the n-th one of the n feedback multipliers, multiplied by forward coefficients, respectively; a second adder, receiving output signals of the n+1 forward multipliers and outputting a filtered sample signal; and a demultiplexer that receives the filtered sample signal, for outputting the filtered sample signal to one of m terminals of the demultiplexer with respect to the sample signal decided by the control signal.

The present invention also provides a method of filtering digital signals comprising: (a) dividing time into a plurality of time slots, each time slot corresponding to one of m digital signals, sequentially; (b) selecting a first signal from the m digital signals in one time slot by a control signal; (c) adding the first signal with the product of a set of state signals corresponding to the first signal and a set of feedback coefficients, respectively, to obtain a second signal; (d) multiplying the second signal and the set of state signals corresponding to the first signal with a set of forward coefficients, respectively, and adding all the products to obtain an output signal of the first signal; (e) storing the second signal into the set of state signals corresponding to the first signal, and then, cyclically dealing with the next input signal at next time slot.

The time-division multiplexing digital filter of the present invention has certain features, such as multiplexing, time-division, that truly differ from those of a conventional digital filter.

BRIEF DESCRIPTION OF THE DRAWINGS

Other objects, features and advantages of the present invention will become apparent by way of the following detailed description of the preferred but nonlimiting embodiment. The description is made with reference to the accompanying drawings, wherein.

DETAILED DESCRIPTION OF THE PRESENTLY PREFERRED EMBODIMENT OF THE INVENTION

Figure 2:
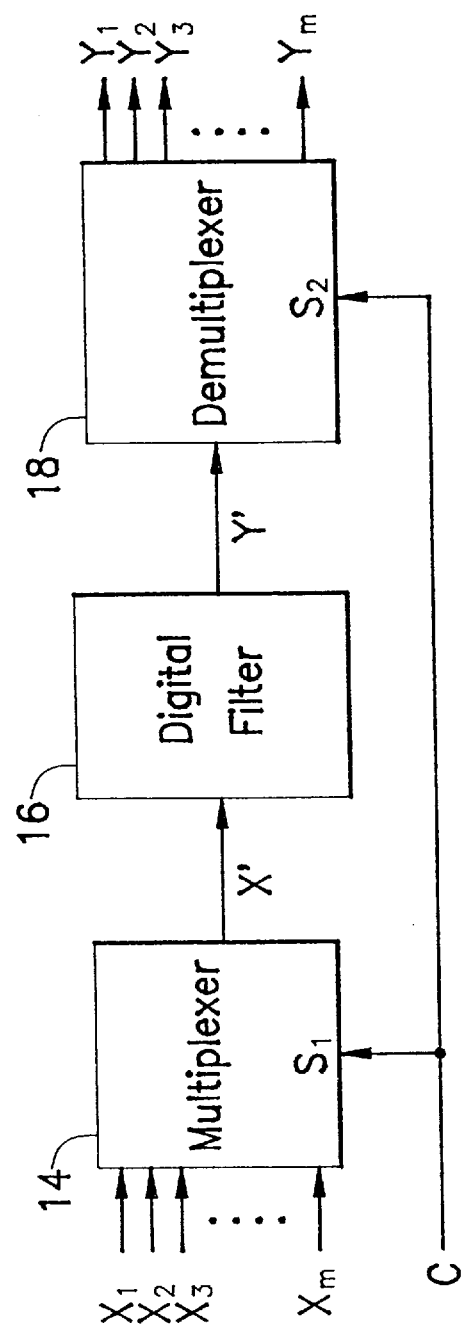
FIG. 2 is a block diagram of a time-division-multiplexing digital filter of the present invention.

With reference to FIG. 2, which schematically shows a block diagram of this kind of a time-division multiplexing digital filter, according to the present invention, the multiplexer 14 receives m input signals $X_1$–$X_m$ ready for filtering and outputs one signal, based on a control signal C. The control signal C is a timing controller and can divide time into m time slots, cyclically, each of which slots corresponds to one of the m input signals $X_1$–$X_m$. Therefore, the first time slot belongs to the input signal $X_1$, the second time slot to the input signal $X_2$, and so on, the m-th time slot to the input signal $X_m$, then the (m+1)th time slot to the input signal $X_1$ again. At a certain time slot, a sample signal X' from the multiplexer 14 will be received by a multiplexing digital filter 16. The multiplexing digital filter 16 specially made in the present invention performs a desired filtering function and outputs the filtered sample signal Y' to a demultiplexer 18. The demultiplexer 18 outputs the filtered sample signal Y' as one of the output signals $Y_1$–$Y_m$ decided by the control signal C. The control signal C connects to select terminals $S_1$ and $S_2$ of the multiplexer 14 and demultiplexer 18, respectively, for matching both sets of the input signals $X_1$–$X_m$ and the output signals $Y_1$–$Y_m$.

Figure 1:
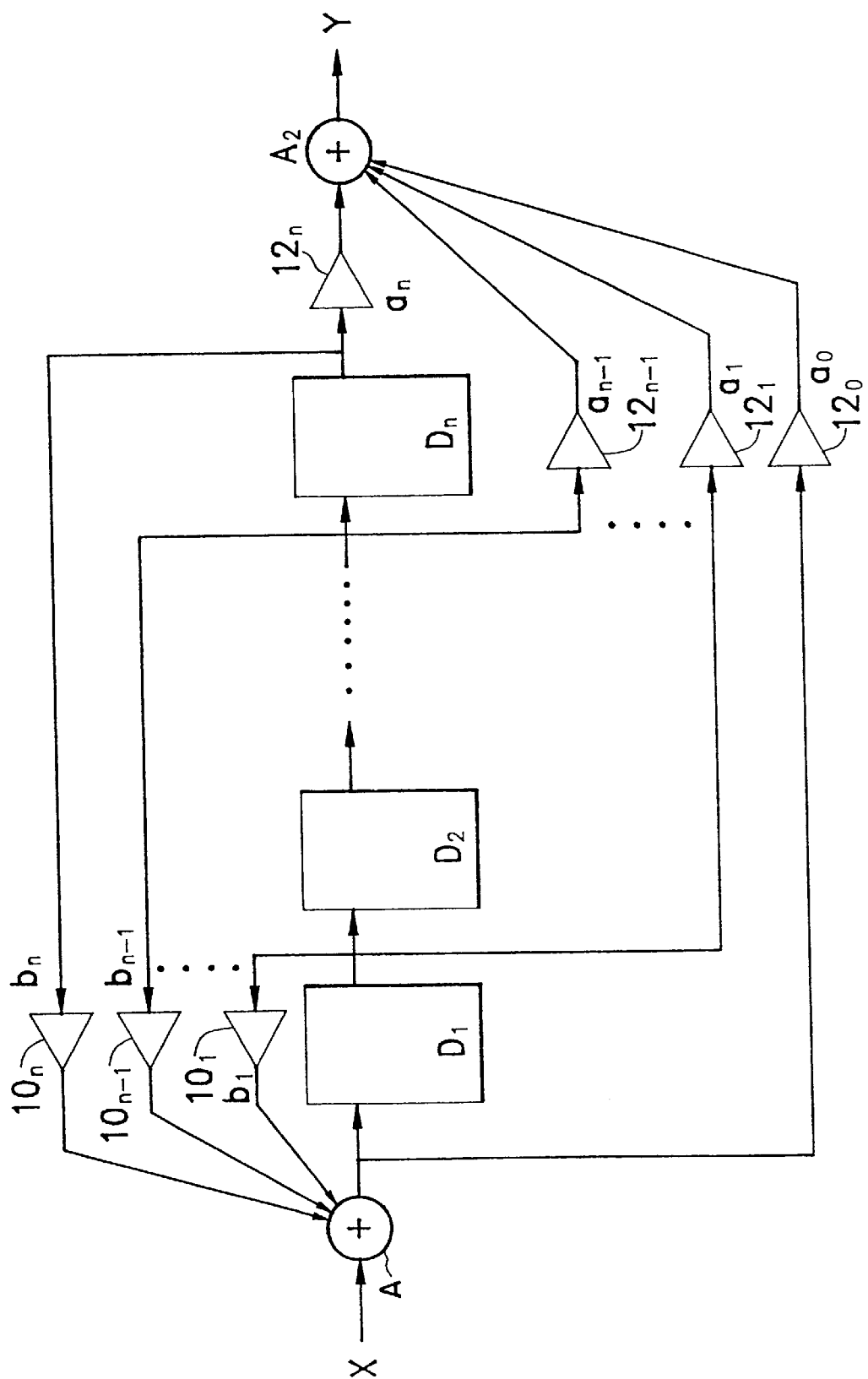
FIG. 1 (Prior Art) is a detailed block diagram of the general configuration of an IIR digital filter in the prior art.
Figure 3:
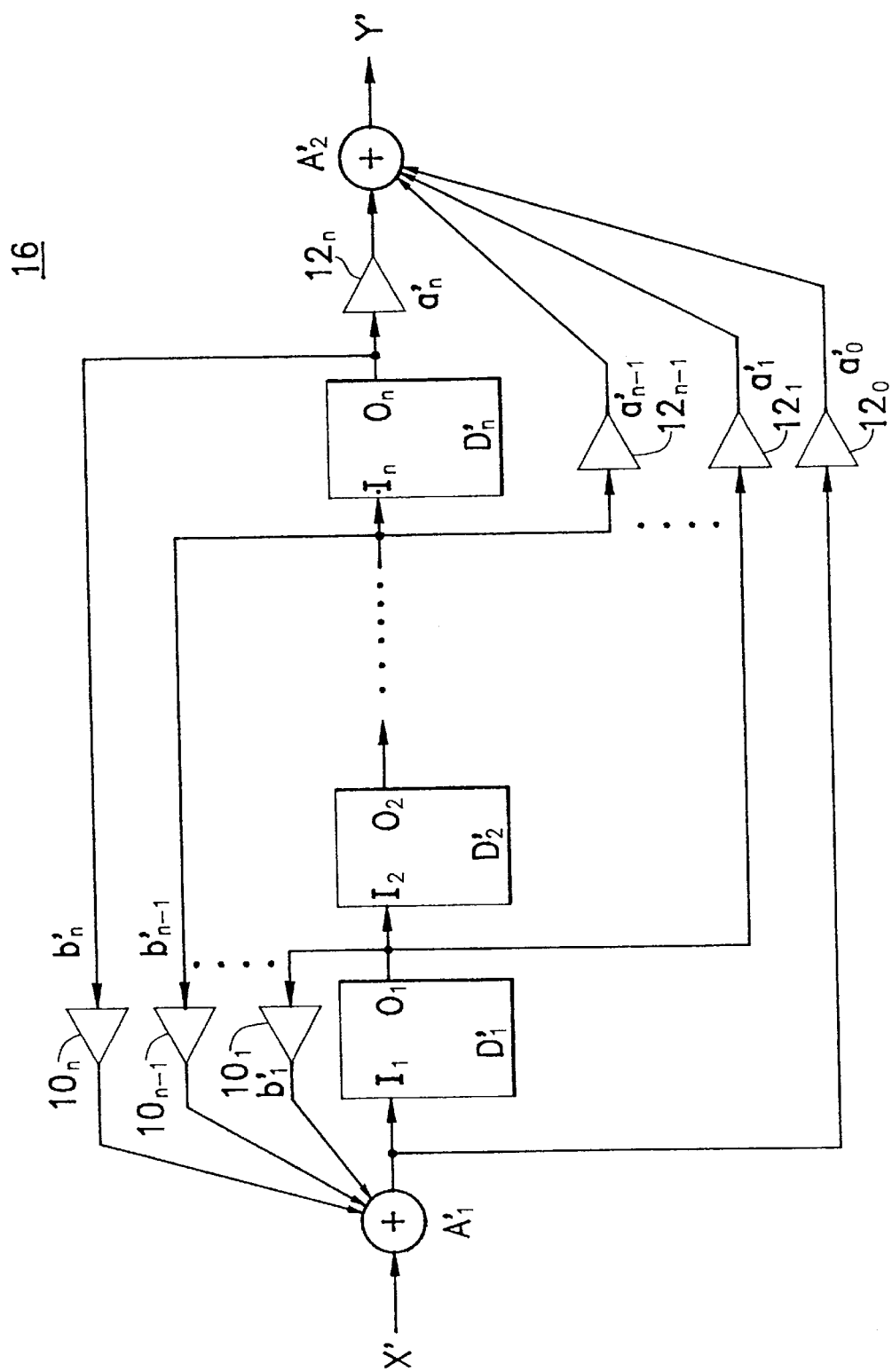
FIG. 3 is a detailed block diagram of a configuration of the digital filter in a time-division multiplexing digital filter of the present invention.

The multiplexing digital filter 16, which can handle a set of digital signals, is shown in FIG. 3. The construction of the digital filter 16 in FIG. 3 is similar to that shown in FIG. 1, except that the series of n unit-delay devices $D_{1-Dn}$ is replaced by a series of n pipeline registers $D_1'$–$D_n'$. The function of each pipeline register is to delay the input signal entering this pipeline register by m time slots, where m is the number of the input digital signals entering the digital filter shown in FIG. 2. Therefore, for any input signal entering the multiplexing digital filter 16, i.e., the state, signals in the output terminals $O_1$–$O_n$ of the pipeline registers $D_{1'-Dn'}$, will be matched in each time slot and have no crosstalk between them. The string of n pipeline registers $D_1'$–$D_{n'}$ in the present invention is designed for handling a set of m digital signals.

Figure 4:
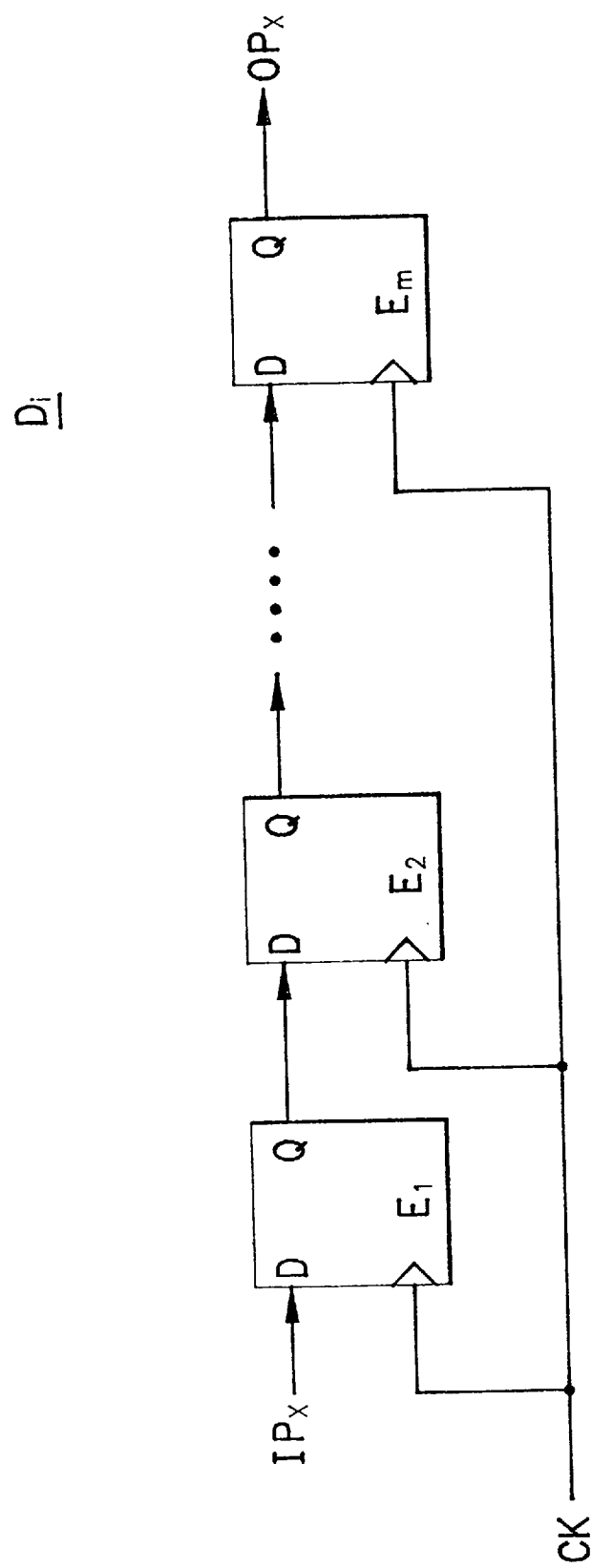
FIG. 4 is a circuit diagram of a pipeline register in the digital filter, as shown in FIG. 3.

Each of the pipeline registers $D_1'$–$D_{n'}$ can be constructed by a string of m unit-delay devices shown in FIG. 4. The first unit-delay device $E_1$ receives the signal $IP_x$ and the m-th unit-delay device $E_m$ outputs the signal $OP_x$, where x represents the index of the pipeline register. All n unit-delay devices are controlled by a clock signal CK, which is synchronized with the time slot of the digital filter. The unit-delay device can be implemented by a D-type flip-flop or the like.

The method for filtering a set of digital signals is to match each digital input signal with its own state signals within the multiplexing digital signal. We adopt a series of pipeline registers, which can hold its input signal for a finite time slot to do so. The state signals corresponding to one of the digital input signals can be stored for m time slots until the next time slot that belongs to this digital signal is reached.

Compared with the prior art, the present invention can save a large amount of chip area when utilized in an integrated circuit. There is no need to design a plurality of duplicate digital filters to handle a set of digital signals requiring the same filtering function. On the other hand, all input signals can be treated by the same digital filter and not produce any variance between them due to the duplicate digital filters. The foregoing description of preferred embodiments of the present invention has been provided for the purposes of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A digital filter for receiving m input signals and a control signal, and for performing a certain filtering function, wherein m is an integer greater than 1, said digital filter comprising:

a multiplexer receiving said m input signals, for outputting a sample signal selected from said m input signals decided by said control signal;

a multiplexing digital filter receiving said sample signal, for performing said certain filtering function and outputting a filtered sample signal; and a demultiplexer receiving said filtered sample signal, for outputting said filtered sample signal to one of m terminals of said demultiplexer with respect to said sample signal decided by said control signal, wherein said multiplexing digital filter comprises:

n pipeline registers serially connected, each pipeline register holding its input signal m delay time;

n feedback multipliers, receiving n output signals of said n pipeline registers and multiplying said n output signals by feedback coefficients;

a first adder, receiving said sample signal and output signals of said n feedback multipliers and outputting an input signal to the first one of said n pipeline registers;

n+1 forward multipliers, receiving input signals of said n pipeline registers and an output signal of the n-th one of said n feedback multipliers, multiplied by forward coefficients, respectively; and a second adder, receiving output signals of said n+1 forward multipliers and outputting said filtered sample signal.

2. A digital filter as claimed in claim 1, wherein each pipeline register comprises:

m unit-delay devices serially connected, for delaying the input signal of said pipeline register m delay time, each unit-delay device controlled by a clock signal.

3. A digital filter as claimed in claim 2, wherein each said unit-delay device is a D-type flip-flop.

4. A digital filter for receiving m input signals and a control signal and for performing a certain filtering function, wherein m is an integer greater than 1, said digital filter comprising:

a multiplexer receiving said m input signals, for outputting a sample signal selected from said m input signals decided by said control signal;

n pipeline registers serially connected, each pipeline register holding its input signal m delay time;

n feedback multipliers, receiving n output signals of said n pipeline registers and multiplying said output signals by respective feedback coefficients;

a first adder, receiving said sample signal and n output signals of said n feedback multipliers and outputting an input signal to the first one of said n pipeline registers;

n+1 forward multipliers, receiving input signals of said n pipeline registers and an output signal of the n-th one of said n feedback multipliers, multiplied by respective forward coefficients;

a second adder, receiving output signals of said n+1 forward multipliers and outputting a filtered sample signal; and a demultiplexer receiving said filtered sample signal, for outputting said filtered sample signal to one of m terminals of said demultiplexer with respect to said sample signal decided by said control signal.

5. A digital filter as claimed in claim 4, wherein each pipeline register comprises:

m unit-delay devices serially connected, for delaying the input signal of said pipeline register m delay time, each unit-delay device controlled by a clock signal.

6. A digital filter as claimed in claim 5, wherein each said unit-delay device is a D-type flip-flop.

7. A method of filtering digital signals comprising:

(a) dividing time into a plurality of time slots, each time slot corresponding to one of m digital signals, sequentially;

(b) selecting a first signal from said m digital signals in one time slot based on a control signal;

(c) adding said first signal with a product of a set of state signals corresponding to said first signal and a set of feedback coefficients, respectively, to obtain a second signal;

(d) multiplying said second signal and said set of state signals with a set of forward coefficients, respectively, to obtain products and adding the products to obtain an output signal corresponding to said first signal;

(e) storing said second signal as said set of state signals corresponding to said first signal;

(f) repeating steps (b)–(f) in the next time slot.

8. A method of filtering digital signals as claimed in claim 7, wherein said step of adding comprises the step of generating a set of state signals using serially connected pipeline registers.

9. A method of filtering digital signals as claimed in claim 8, wherein each of said pipeline registers comprises serially connected unit-delay devices.

10. A method of filtering digital signals as claimed in claim 9, wherein each of said unit-delay devices is a D-type flip-flop.

* * * * *